United States Patent
Okazawa

(10) Patent No.: US 11,574,797 B2
(45) Date of Patent: Feb. 7, 2023

(54) MULTIPLE-CHARGED PARTICLE-BEAM IRRADIATION APPARATUS AND MULTIPLE-CHARGED PARTICLE-BEAM IRRADIATION METHOD

(71) Applicant: NUFLARE TECHNOLOGY, INC., Yokohama (JP)

(72) Inventor: Mitsuhiro Okazawa, Yokohama (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 0 days.

(21) Appl. No.: 17/448,559

(22) Filed: Sep. 23, 2021

(65) Prior Publication Data

US 2022/0102113 A1 Mar. 31, 2022

(30) Foreign Application Priority Data

Sep. 29, 2020 (JP) ............... JP2020-164005

(51) Int. Cl.
*H01J 37/317* (2006.01)
*H01J 37/304* (2006.01)
*H01J 37/04* (2006.01)

(52) U.S. Cl.
CPC ........ *H01J 37/3177* (2013.01); *H01J 37/045* (2013.01); *H01J 37/304* (2013.01);
(Continued)

(58) Field of Classification Search
CPC ...... H01J 37/317; H01J 37/045; H01J 37/304; H01J 2237/0435; H01J 2237/0458; H01J 2237/1501
See application file for complete search history.

(56) References Cited

U.S. PATENT DOCUMENTS 5,731,591 A 3/1998 Yamada et al.
6,894,295 B2 5/2005 Shimazu et al.
(Continued)

FOREIGN PATENT DOCUMENTS

JP 02-125608 A 5/1990
JP 06-005499 A 1/1994
(Continued)

OTHER PUBLICATIONS

Combined Taiwanese Office Action and Search Report dated Feb. 16, 2022 in Patent Application No. 110117150 (with English machine translation), 13 pages.
(Continued)

*Primary Examiner* — Sean M Luck
(74) *Attorney, Agent, or Firm* — Oblon, McClelland, Maier & Neustadt, L.L.P.

(57) ABSTRACT

A multiple-charged particle-beam irradiation apparatus includes a shaping aperture array substrate that causes a charged particle beam to pass through a plurality of first apertures to form multi-beams, a plurality of blanking aperture array substrates each provided with a plurality of second apertures, which enable corresponding beams to pass, and including a blanker arranged at each of the second apertures, a movable table on which the blanking aperture array substrates are mounted so as to be spaced apart from each other in a second direction, which is orthogonal to a first direction along an optical axis, and that moves in the second direction to position one of the blanking aperture array substrates on the optical axis, and an alignment mechanism that performs an alignment adjustment between the blanking aperture array substrate on the optical axis and the shaping aperture array substrate.

9 Claims, 12 Drawing Sheets

(52) U.S. Cl.
CPC .............. *H01J 2237/0435* (2013.01); *H01J 2237/0458* (2013.01); *H01J 2237/1501* (2013.01)

(56) References Cited

U.S. PATENT DOCUMENTS

| | | |
|---|---|---|
| 8,546,767 B2 | 10/2013 | Platzgummer et al. |
| 2017/0146910 A1 | 5/2017 | Nanao |
| 2019/0066972 A1* | 2/2019 | Frosien ............... H01J 37/3177 |
| 2020/0203116 A1 | 6/2020 | Winkler et al. |

FOREIGN PATENT DOCUMENTS

| | | |
|---|---|---|
| JP | 09-199393 A | 7/1997 |
| JP | 2002-222765 A | 8/2002 |
| JP | 2017-098429 A | 6/2017 |

OTHER PUBLICATIONS

Office Action dated Aug. 1, 2022, Issued in corresponding Taiwanese patent application No. 11120755640 (with English translation).

\* cited by examiner

MULTIPLE-CHARGED PARTICLE-BEAM IRRADIATION APPARATUS AND MULTIPLE-CHARGED PARTICLE-BEAM IRRADIATION METHOD

CROSS-REFERENCE TO RELATED APPLICATIONS

This application is based upon and claims the benefit of priority from Japanese Patent Application No. 2020-164005, filed on Sep. 29, 2020, the entire contents of which are incorporated herein by reference.

FIELD

Embodiments of the present invention relate to a multiple-charged particle-beam irradiation apparatus and a multiple-charged particle-beam irradiation method.

BACKGROUND

The circuit line width required for a semiconductor device has been reduced year by year with increases in the density of an LSI (Large-Scale Integration). In order to form a desired circuit pattern on a semiconductor device, a method of transferring a highly-precise original pattern (a mask, or a pattern called "reticle" which is particularly used in a stepper or a scanner) formed on quartz onto a wafer in a reduced size using a reduced projection exposure device is adopted. The highly-precise original pattern is written by an electron beam writing apparatus and a so-called "electron beam lithography technology" is used.

A writing apparatus using multi-beams can irradiate more beams at one time than in a case of performing writing with one electron beam and therefore can greatly improve the throughput. In a multi-beam writing apparatus using a blanking aperture array substrate, which is one mode of multi-beam writing apparatuses, for example, a shaping aperture array substrate including a plurality of apertures provided thereon is mounted on a stage and an alignment adjustment between the shaping aperture array substrate and the blanking aperture array substrate on which a plurality of apertures and a blanker (an electrode pair) for each of the apertures are provided is performed by moving the stage (for example, see Patent Literature 1). In a writing process after the alignment, an electron beam emitted from one electron gun is caused to pass through the shaping aperture array substrate to form multi-beams (a plurality of electron beams), each beam of the formed multi-beams is caused to pass through a corresponding aperture of the blanking aperture array substrate, and whether to perform deflection is individually selected for each beam by a blanker placed at the corresponding aperture. Electron beams deflected by the blankers are shielded and undeflected electron beams are irradiated to a specimen to be used for writing. In order to avoid influences on locational accuracy of electron beams due to collision between electron beams and molecules in the air, irradiation of the electron beams is performed in a state where a vacuum is maintained in the electron lens barrel of the multi-beam writing apparatus.

SUMMARY

However, when a blanking aperture array substrate having a degraded performance is to be replaced in the existing multi-beam writing apparatuses, the apparatuses need to be open to the atmosphere, be disassembled, and be reassembled and the operation rate of the apparatuses is therefore reduced.

An object of the present invention is to provide a multiple-charged particle-beam irradiation apparatus and a multiple-charged particle-beam irradiation method that enable appropriate replacement of the blanking aperture array substrate while preventing reduction in the operation rate.

A multiple-charged particle-beam irradiation apparatus according to an aspect of the present invention includes: an emitter configured to emit a charged particle beam; a shaping aperture array substrate on which a plurality of first apertures are provided and configured to partially enable the charged particle beam to pass through the first apertures to form multi-beams; a plurality of blanking aperture array substrates each provided with a plurality of second apertures, which enable corresponding beams of the multi-beams to pass, and including blankers respectively disposed in the second apertures to perform blanking deflection of the beams; a movable table on which the blanking aperture array substrates are mounted so as to be spaced apart from each other in a second direction, which is orthogonal to a first direction along an optical axis, and configured to move in the second direction to position one of the blanking aperture array substrates on the optical axis; and an alignment mechanism configured to perform an alignment adjustment between one of the blanking aperture array substrates positioned on the optical axis and the shaping aperture array substrate.

In the multiple-charged particle-beam irradiation apparatus according to the above aspect, the apparatus may further include a control circuit configured to switch among the blankers of the blanking aperture array substrates to be driven to drive blankers of one blanking aperture array substrate located on the optical axis.

In the multiple-charged particle-beam irradiation apparatus according to the above aspect, the alignment mechanism may be common to the blanking aperture array substrates.

In the multiple-charged particle-beam irradiation apparatus according to the above aspect, the movable table may have an aperture of a size enabling all beams of the multi-beams to pass between the blanking aperture array substrates, and may be capable of moving to a location where the aperture enables all the beams to pass in order to allow a beam adjustment in a state where none of the blanking aperture array substrates is positioned on the optical axis.

In the multiple-charged particle-beam irradiation apparatus according to the above aspect, the movable table may include a first movable table on which some blanking aperture array substrates among the blanking aperture array substrates are mounted, and a second movable table on which other blanking aperture array substrates among the blanking aperture array substrates are mounted, and the first movable table and the second movable table are respectively capable of moving to a location where a gap of a size enabling all beams of the multi-beams to pass is formed between the first movable table and the second movable table in order to allow a beam adjustment in a state where none of the blanking aperture array substrates is positioned on the optical axis.

In the multiple-charged particle-beam irradiation apparatus according to the above aspect, the apparatus may further include an actuator configured to drive the movable table, wherein the actuator is arranged at a location overlapping with the optical axis in a third direction orthogonal to both the first direction and the second direction.

In the multiple-charged particle-beam irradiation apparatus according to the above aspect, the apparatus may further include a second shaping aperture array substrate which is disposed on at least one of the blanking aperture array substrates and is provided with third apertures smaller than the first apertures of the shaping aperture array substrate.

In the multiple-charged particle-beam irradiation apparatus according to the above aspect, a plurality of the shaping aperture array substrates may be provided, and the apparatus may further include a second movable table on which the shaping aperture array substrates are mounted so as to be spaced apart from each other in the second direction, and being configured to move in the second direction to position one of the shaping aperture array substrates on the optical axis.

A multiple-charged particle-beam irradiation method according to another aspect includes: moving a movable table in a second direction orthogonal to a first direction along an optical axis to position one of a plurality of blanking aperture array substrates on the optical axis, the movable table mounting the blanking aperture array substrates so as to be spaced apart from each other in the second direction, each of the blanking aperture array substrates being provided with a plurality of second apertures and a blanker for each of the second apertures; performing an alignment adjustment between one of the blanking aperture array substrates positioned on the optical axis and a shaping aperture array substrate which is provided with a plurality of first apertures; emitting a charged particle beam; partially causing the charged particle beam to pass through the first apertures using the shaping aperture array substrate to form multi-beams; and performing blanking deflection of corresponding beams of the multi-beams using blankers of one of the blanking aperture array substrates positioned on the optical axis.

According to the present invention, blanking aperture array substrates can be appropriately replaced while the reduction in the operation rate is prevented.

DETAILED DESCRIPTION

Figure 1:
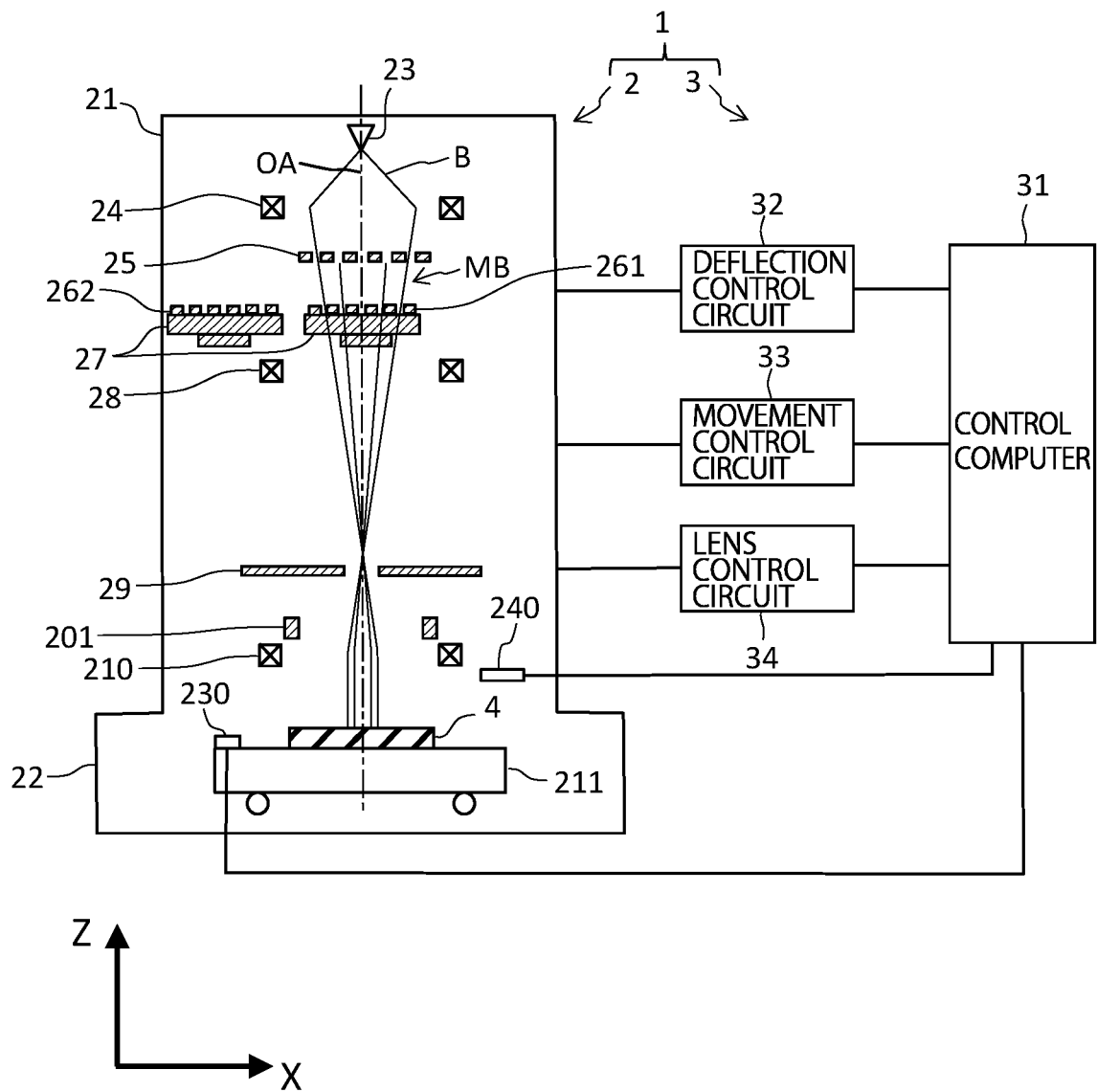
FIG. 1 is an overall diagram illustrating a multiple-charged particle-beam irradiation apparatus according to an embodiment.

Embodiments of the present invention will be explained below with reference to the accompanying drawings. It is not to be understood that the present invention is limited to these embodiments. In the drawings referred to in the embodiments, same parts or parts having identical functions are denoted by like or similar reference characters and there is a case where redundant explanations thereof are omitted.

A configuration in which electron beams are used as an example of charged particle beams is explained in the following embodiments. However, the charged particle beams are not limited to electron beams and may be ion beams or the like. In the following embodiments, a multi-beam writing apparatus is explained as an example of a multiple-charged particle-beam irradiation apparatus.

As illustrated in FIG. 1, a multi-beam writing apparatus 1 according to the present embodiment includes a writing part 2 in which a vacuum state is maintained and that irradiates electron beams to a specimen such as a mask or a wafer to write a desired pattern thereon, and a controller 3 that controls a writing operation of the writing part 2. The writing part 2 includes an electron beam lens barrel 21 and a writing chamber 22.

As illustrated in FIG. 1, an electron gun 23 being an example of an emitter, an illuminating lens 24, a shaping aperture array substrate 25, a first blanking aperture array substrate 261 and a second blanking aperture array substrate 262 being an example of a plurality of blanking aperture array substrates, a movable table 27, a distortion adjusting lens 28, a restricting aperture substrate 29, a deflector 201, and an objective lens 210 are arranged in the electron beam lens barrel 21. Each of the illuminating lens 24, the distortion adjusting lens 28, and the objective lens 210 is constituted of at least one of an electromagnetic lens and an electrostatic lens. An XY stage 211 is placed in the writing chamber 22. A mask blank being a substrate 4 as a writing target is mounted on the XY stage 221. The substrate 4 as the writing target includes, for example, a wafer, and an exposure mask for transferring a pattern onto a wafer using a reduced projection exposure apparatus or an extreme ultraviolet exposure apparatus such as a stepper or a scanner that uses an excimer laser as a light source. The writing target substrate 4 also includes a mask on which a pattern is already formed. For example, a Levenson mask requires two times of writing and there are cases where a second pattern is written on an object that has been subjected to writing once and that has been processed into a mask.

Figure 2:
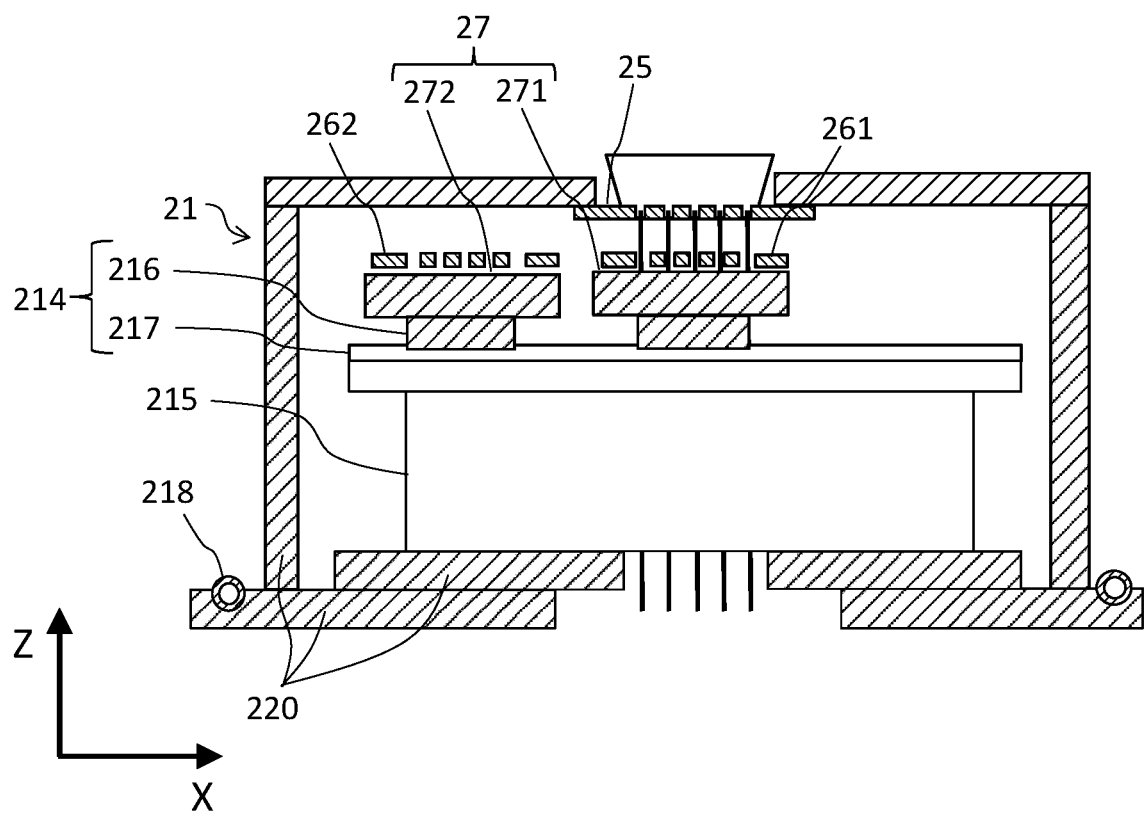
FIG. 2 is a cross-sectional view illustrating relevant parts of the multiple-charged particle-beam irradiation apparatus according to the embodiment.
Figure 3:
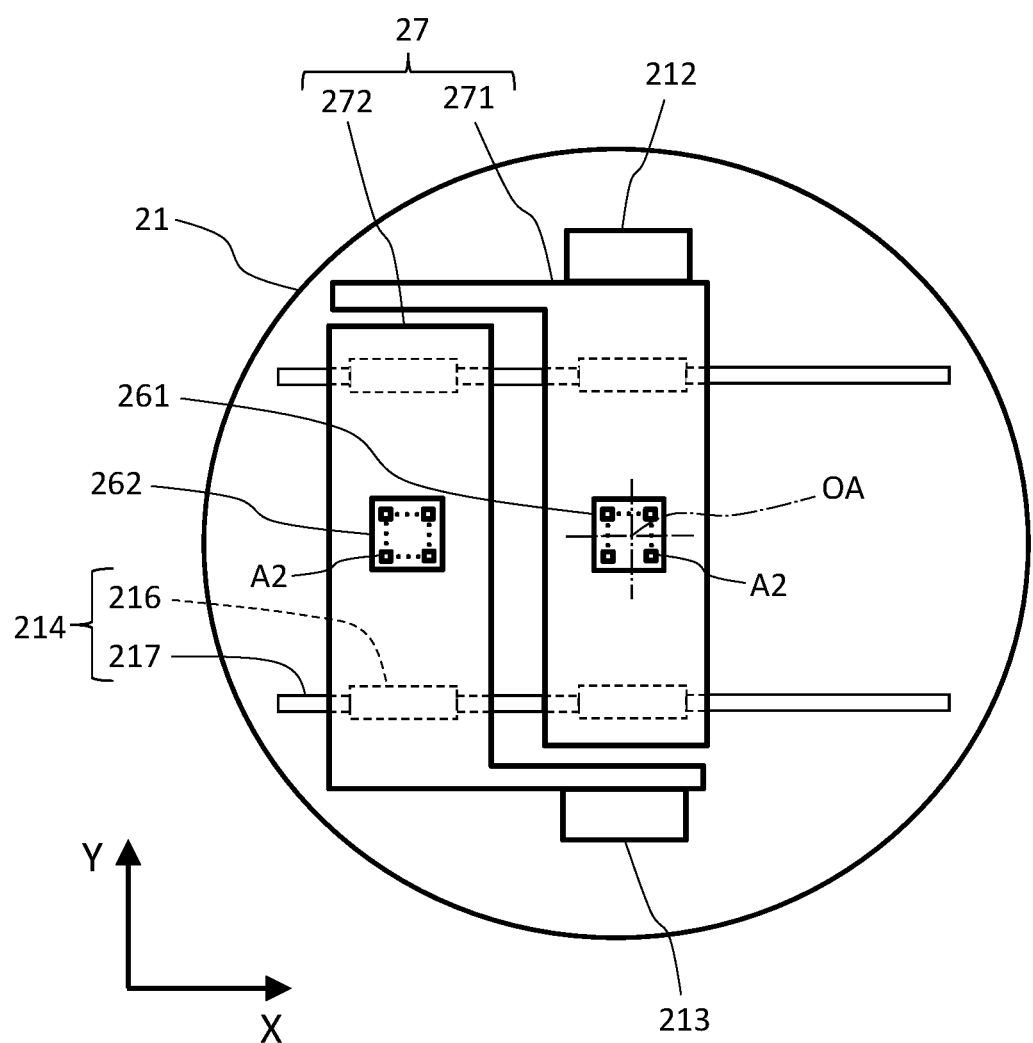
FIG. 3 is a plan view illustrating relevant parts of the multiple-charged particle-beam irradiation apparatus according to the embodiment.

As illustrated in FIGS. 2 and 3, a first motor 212 and a second motor 213 being an example of an actuator, a movement guide member 214, and an XYZθ stage 215 being an example of an alignment mechanism are also arranged in the electron beam lens barrel 21.

Figure 4:
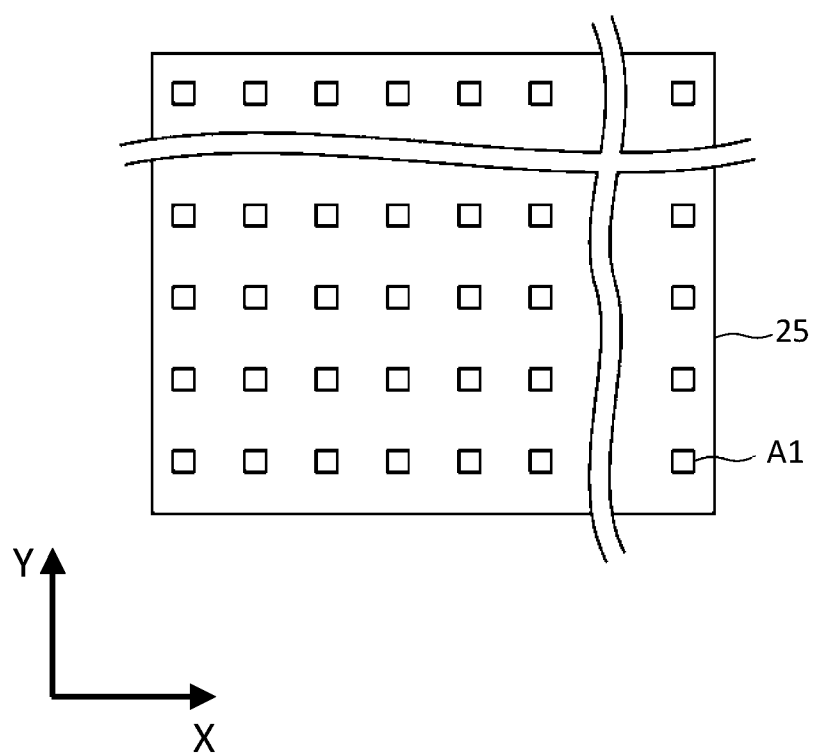
FIG. 4 is a plan view illustrating a shaping aperture array substrate.

The shaping aperture array substrate 25 is a member including a plurality of first apertures formed thereon and partially allowing a charged particle beam to pass through the first apertures to form multi-beams. Specifically, as illustrated in FIG. 4, m lines (m≥1) in a Y direction (a third direction) and n lines (n≥2) in an X direction (a second direction) of apertures (first apertures) A1 are formed at a predetermined array pitch on the shaping aperture array substrate 25. The apertures A1 are all formed into a rectangle having a same dimension and a same shape. The shape of the apertures A1 may be circular. An electron beam B partially passes through these apertures A1, so that the multi-beams MB are formed.

The first blanking aperture array substrate 261 and the second blanking aperture array substrate 262 are placed below the shaping aperture array substrate 25, that is, on the outgoing side of beams. Either the first blanking aperture array substrate 261 or the second blanking aperture array substrate 262 can be located on an optical axis OA in FIG. 3 due to movement in a horizontal direction (the X direction or the Y direction) of the movable table 27 described above.

Each of the first blanking aperture array substrate 261 and the second blanking aperture array substrate 262 is a member where a plurality of second apertures that allow corresponding beams of the multi-beams to pass are provided and a blanker that performs blanking deflection of a beam is arranged at each of the second apertures. More specifically, as illustrated in FIG. 3, apertures (second apertures) A2 corresponding to the apertures A1 on the shaping aperture array substrate 25 are formed on each of the first blanking aperture array substrate 261 and the second blanking aperture array substrate 262. The array directions of the apertures A2 on the blanking aperture array substrates 261 and 262 are the X direction and the Y direction similarly to the array direction of the apertures A1 on the shaping aperture array substrate 25. The array pitch of the apertures A2 is narrower than that of the apertures A1. The array pitches of the apertures A2 of the first blanking aperture array substrate 261 and the second blanking aperture array substrate 262 are equal. A blanker (not illustrated) including a set of two paired electrodes is arranged at each of the apertures A2. One electrode of the electrode pair constituting the blanker is fixed at a ground potential and the other electrode is switched between the ground potential and another potential. Each of the apertures A2 allows the corresponding beam of the multi-beams MB formed by the electrode beam B having passed through the apertures A1 on the shaping aperture array substrate 25 to pass. The electron beam passing through each of the apertures A2 is individually deflected by a voltage applied to the associated blanker. In this way, each of the blankers performs blanking deflection of the corresponding beam.

The movable table 27 is a member on which the blanking aperture array substrates 261 and 262 are mounted in the X direction (the second direction) orthogonal to a Z direction (a first direction) along the optical axis OA while being spaced apart from each other and which is moved in the X direction to position one of the blanking aperture array substrates 261 and 262 on the optical axis OA. That is the blanking aperture array substrates 261 and 262 are mounted on the movable table 27 with a space therebetween in the X direction. More specifically, as illustrated in FIG. 3, the movable table 27 includes a first movable table 271 and a second movable table 272. The first blanking aperture array substrate 261 is mounted on the first movable table 271. The second blanking aperture array substrate 262 is mounted on the second movable table 272. The first movable table 271 includes apertures (not illustrated) that allow the multi-beams MB having passed through the first blanking aperture array substrate 261 to pass. The second movable table 272 includes apertures (not illustrated) that allow the multi-beams MB having passed through the second blanking aperture array substrate 262 to pass. As illustrated in FIG. 3, the first movable table 271 is driven by the first motor 212 to move in the X direction. The second movable table 272 is driven by the second motor 213 and can move in the X direction independently of the first movable table 271. The movement of the first movable table 271 in the X direction due to driving by the first motor 212 and the movement of the second movable table 272 in the X direction due to driving by the second motor 213 are guided by two sets of movement guide members 214 common to the first movable table 271 and the second movable table 272. Each of the movement guide members 214 includes guide blocks 216 respectively fixed to bottom surfaces of the first movable table 271 and the second movable table 272, and a guide rail 217 extending in the X direction and slidably supporting the guide blocks 216. The first motor 212 and the second motor 213 are arranged at locations overlapping with the optical axis OA in the Y direction (the third direction) orthogonal to both the Z direction (the first direction) and the X direction (the second direction). Specific modes of the first motor 212 and the second motor 213 are not particularly limited and can be, for example, an ultrasonic motor or a piezoelectric motor.

The XYZθ stage 215 is a member that performs an alignment adjustment between one blanking aperture array substrate 261 or 262 positioned on the optical axis OA and the shaping aperture array substrate 25. The XYZθ stage 215 is a component common to the first blanking aperture array substrate 261 and the second blanking aperture array substrate 262. That is, the XYZθ stage 215 is used for both alignment between the first blanking aperture array substrate 261 and the shaping aperture array substrate 25 and alignment between the second blanking aperture array substrate 262 and the shaping aperture array substrate 25. More specifically, the XYZθ stage 215 illustrated in FIG. 2 is located below the blanking aperture array substrates 261 and 262 (that is, on the beam outgoing side) and supports the guide rails 217 of the moving guide members 214 from below. As described above, the guide blocks 216 are slidably supported on each of the guide rails 217, the movable table 27 is fixed to the guide blocks 216, and the blanking aperture array substrates 261 and 262 are mounted on the movable table 27. Therefore, when the XYZθ stage 215 is moved and this movement is transmitted to the blanking array substrate 261 or 262 on the optical axis OA via the guide rails 217, the guide blocks 216, and the movable table 27, the blanking aperture array substrate 261 or 262 on the optical axis OA can be moved in the same direction as the XYZθ stage 215. Accordingly, the alignment adjustment between the blanking aperture array substrate 261 or 262 on the optical axis OA and the shaping aperture array substrate 25 can be performed. The XYZθ stage 215 can perform the alignment adjustment by moving the blanking aperture array substrate 261 or 262 on the optical axis OA in at least one of the X direction, the Y direction, the Z direction, and a θ direction. The XYZθ stage 215 may be, for example, a piezoelectric stage. A YZθ stage may be adopted as an alignment mechanism instead of the XYZθ stage 215.

In order to prevent the shaping aperture array substrate 25 exposed to the electron beam B from expanding with heat of the electron beam B to cause a change in the aperture pitch or in order to cool heat generated by electric circuits (circuits connected to the blankers) of the blanking aperture array substrates 261 and 262, the writing part 2 further includes a cooling structure for the shaping aperture array substrate 25 and the blanking aperture array substrates 261 and 262. The cooling structure includes a cooling flow path 218 configured to enable a coolant to circulate, and a heat transfer path 220 of the electron beam lens barrel 21 between the cooling flow path 218 and the shaping aperture array substrate 25 or the blanking aperture array substrate 261, 262. The shaping aperture array substrate 25 is cooled by heat exchange with the cooling flow path 218 via the heat transfer path 220 between the shaping aperture array substrate 25 and the cooling flow path 218. The blanking aperture array substrates 261 and 262 are cooled by heat exchange with the cooling flow path 218 via the movable table 27, the movement guide members 214, the XYZθ stage 215, and the heat transfer path 220. In order to efficiently cool the shaping aperture array substrate 25 and the blanking aperture array substrates 261 and 262 without influencing the beam trajectory, the heat transfer path 220 is preferably made of non-magnetic pure copper.

Meanwhile, as illustrated in FIG. 1, the controller 3 includes a control computer 31, and a deflection control circuit 32, a movement control circuit 33, and a lens control circuit 34 being examples of a control circuit. The deflection control circuit 32 is connected to the first blanking aperture array substrate 261, the second blanking aperture array substrate 262, and the deflector 201. The movement control circuit 33 is connected to the first motor 212 and the second motor 213 in FIG. 3, and the XYZθ stage 215 in FIG. 2. The lens control circuit 34 is connected to the illuminating lens 24, the distortion adjusting lens 28, and the objective lens 210.

In the multi-beam writing apparatus 1 having the configuration described above, the electron beam B emitted from the electron gun 23 in a state where a vacuum is maintained in the apparatus 1 by an air releasing unit such as a pump is converged by the illuminating lens 24 excited by the lens control circuit 34 so as to form a crossover in a center hole formed on the restricting aperture substrate 29, and illuminates the entire shaping aperture array substrate 25.

The electron beam B passes through the apertures A1 on the shaping aperture array substrate 25, whereby the multi-beams MB are formed. The multi-beams MB pass through the apertures A2 corresponding to the multi-beams MB on one blanking aperture array substrate (the first blanking aperture substrate 261 in FIG. 1) positioned on the optical axis OA. Each beam of the multi-beams MB travels at an angle toward the center hole formed on the restricting aperture substrate 29. Therefore, the entire beam diameter of the multi-beams MB and the beam pitch of the multi-beams MB gradually decrease from a time of passage through the shaping aperture array substrate 25.

The multi-beams MB pass through the first blanking aperture array substrate 261 on the optical axis OA at a pitch narrower than the beam pitch formed by the shaping aperture array substrate 25. The multi-beams MB having passed through the first blanking aperture array substrate 261 on the optical axis OA travel toward the center hole formed on the restricting aperture substrate 29. The deflection control circuit 32 drives the blankers of the first blanking aperture array substrate 261 on the optical axis OA by application of a voltage thereto while not applying a voltage to (not driving) the blankers of the second blanking aperture array substrate 262 retracted from the optical axis OA. At this time, the control computer 31 reads writing data of a pattern from a storage device (not illustrated) and performs a plurality of stages of data conversion processing to the read writing data to generate shot data unique to the apparatus. The amount of irradiation, irradiation location coordinates, and the like of each shot are defined in the shot data. The control computer 31 outputs the amount of irradiation of each shot to the deflection control circuit 32 on the basis of the shot data. The deflection control circuit 32 calculates an irradiation time by dividing the input amount of irradiation by a current density. The deflection control circuit 32 applies a voltage to the corresponding blankers to cause the blankers of the first blanking aperture array substrate 261 on the optical axis OA to pass beams for the calculated irradiation time. The control computer 31 also outputs deflection location data to the deflection control circuit 32 so as to deflect each beam to a location (coordinates) indicated by the shot data. The deflection control circuit 32 computes the amount of deflection and applies a deflection voltage to the distortion adjusting lens 28. This enables the multi-beams MB shot at this time to be collectively deflected.

Accordingly, electron beams are deflected by the blankers of the first blanking aperture array substrate 261 on the optical axis OA, which is driven by the deflection control circuit 32, and the deflected electron beams are displaced from the center hole of the restriction aperture substrate 29 and are shielded by the restriction aperture substrate 29. Meanwhile, electron beams not having been deflected by the blankers of the first blanking aperture array substrate 261 on the optical axis OA pass through the center hole of the restriction aperture substrate 29.

In this way, the restriction aperture substrate 29 shields beams deflected so as to be brought to a beam-OFF state by the blankers of the first blanking aperture array substrate 261 on the optical axis OA. Beams having passed through the restriction aperture substrate 29 from when the beams are brought to a beam-ON state till when the beams are brought to a beam-OFF state are one shot of beams.

The multi-beams MB having passed through the restriction aperture substrate 29 form an aperture image of a desired diminution ratio with respect to the apertures A1 on the shaping aperture array substrate 25 due to the objective lens 210 excited by the lens control circuit 34, and the focusing is adjusted onto the substrate 4. The multi-beams MB having passed through the restriction aperture substrate 29 are collectively deflected to the same direction by the deflector 201 and are irradiated to the irradiation locations of the respective beams on the substrate 4. Accordingly, a pattern is written on the substrate 4.

The performance of the blanking aperture array substrate on the optical axis OA degrades due to influences of the multi-beams MB. When the blanking aperture array substrate having the degraded performance is to be replaced with a new blanking aperture array substrate, the apparatus 1 conventionally needs to be open to the atmosphere and be disassembled. In the present embodiment, in contrast thereto, it is possible to replace the blanking aperture array substrate without bringing the apparatus 1 to the atmosphere and disassembling.

Specifically, when the first blanking aperture array substrate 261 on the optical axis OA is to be replaced with the second blanking aperture array substrate 262 retracted from the optical axis OA, the movement control circuit 33 controls the driving of the first motor 212 to move the first movable table 271 until the first blanking aperture array substrate 261 is retracted from the optical axis OA. The movement control circuit 33 also controls the driving of the second motor 213 to move the second movable table 272 until the second blanking aperture array substrate 262 is positioned on the optical axis OA.

Figure 5:
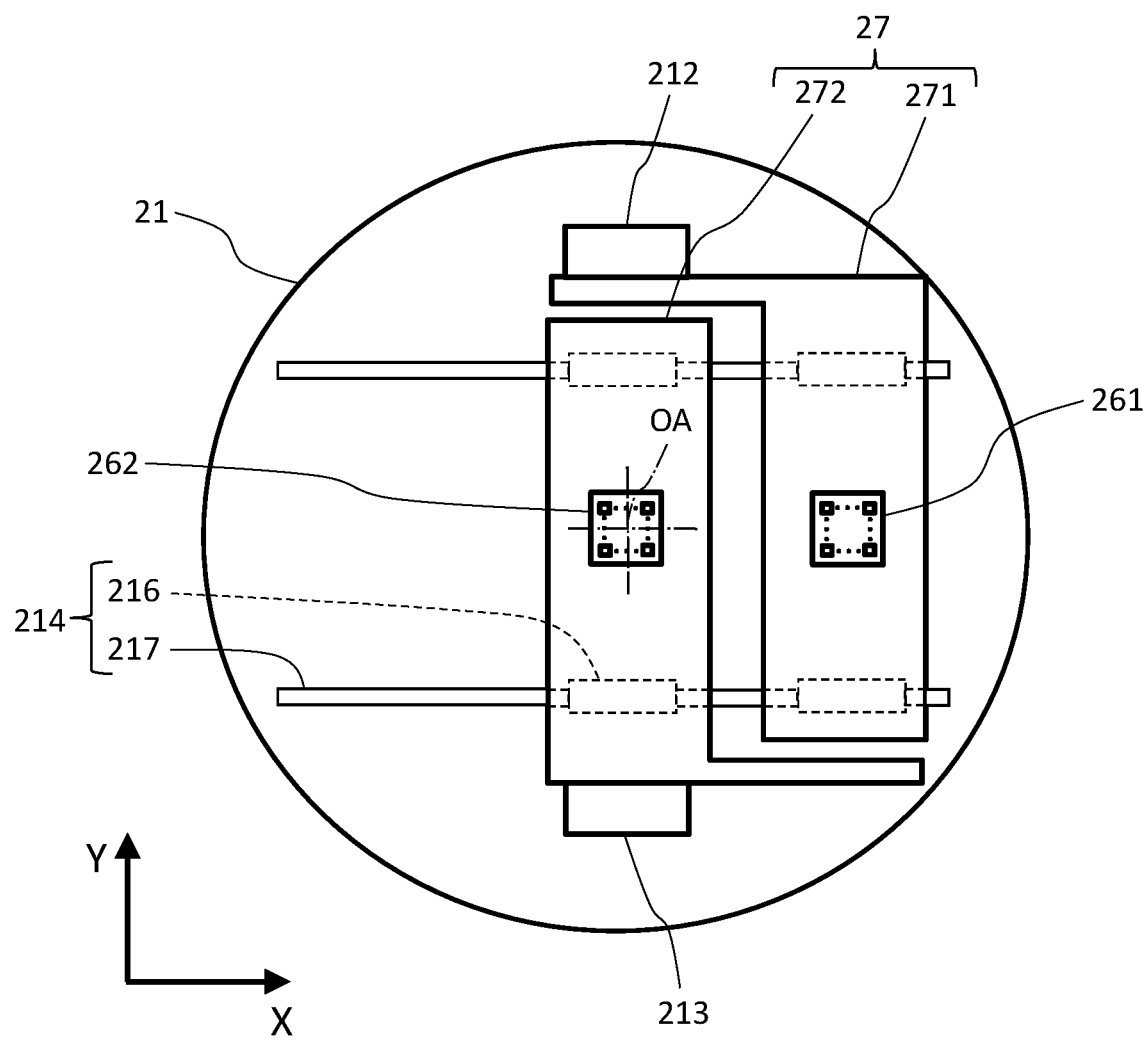
FIG. 5 is a plan view illustrating an operation example of the multiple-charged particle-beam irradiation apparatus according to the embodiment.

Accordingly, as illustrated in FIG. 5, the first blanking aperture array substrate 261 is retracted from the optical axis OA and the second blanking aperture array substrate 262 is positioned on the optical axis OA while the vacuum state is maintained in the apparatus 1.

When the second blanking aperture array substrate 262 is positioned on the optical axis OA, the deflection control circuit 32 drives the blankers of the second blanking aperture array substrate 262 newly positioned on the optical axis OA with application of a voltage while applying no voltage to (not driving) the blankers of the first blanking aperture array substrate 261 retracted from the optical axis OA. In this way, the deflection control circuit 32 performs switching to drive the blankers of one of the blanking aperture array substrates positioned on the optical axis OA with application of a voltage.

When the second blanking aperture array substrate 262 is positioned on the optical axis OA, the XYZθ stage 215 performs an alignment adjustment between the second blanking aperture array substrate 262 and the shaping aperture array substrate 25. In the alignment adjustment, for example, a detector 230 for current beams, such as a Faraday cup, is provided on the XY stage 211, so that the second blanking aperture array substrate 262 is scanned by the XYZA stage 215 in a state where some beams of the multi-beams are turned ON, and a current amount map indicating a distribution of the current amounts of the beams that are ON is created on the basis of a result of beam current detection by the detector 230 and the location of the second blanking aperture array substrate 262. Furthermore, the beams that are ON are changed and the current amount map is created for each of the beams that are ON. The location of the blanking aperture array substrate is adjusted by the XYZθ stage 215 on the basis of the current amount map for each of the beams that are ON. For example, a method described in Japanese Patent Application Laid-Open No. 2019-121730 disclosed by the present applicant can be used as a specific method for this alignment adjustment based on the current amount map.

After the alignment adjustment, the blanking deflection by the second blanking aperture array substrate 262 positioned on the optical axis OA is performed to each of the beams B of the multi-beams MB formed by the shaping aperture array substrate 25.

The multi-beam writing apparatus 1 may perform a beam adjustment in a state where neither of the blanking aperture array substrates 261 and 262 is positioned on the optical axis OA. In this case, the movement control circuit 33 controls the driving of the first motor 212 and the second motor 213 to respectively move the first movable table 271 and the second movable table 272 to a location where a gap of a size that enables all the beams of the multi-beams MB to pass is formed between the first movable table 271 and the second movable table 272 to allow the beam adjustment in the state where neither of the blanking aperture array substrates 261 and 262 is positioned on the optical axis OA.

Figure 6:
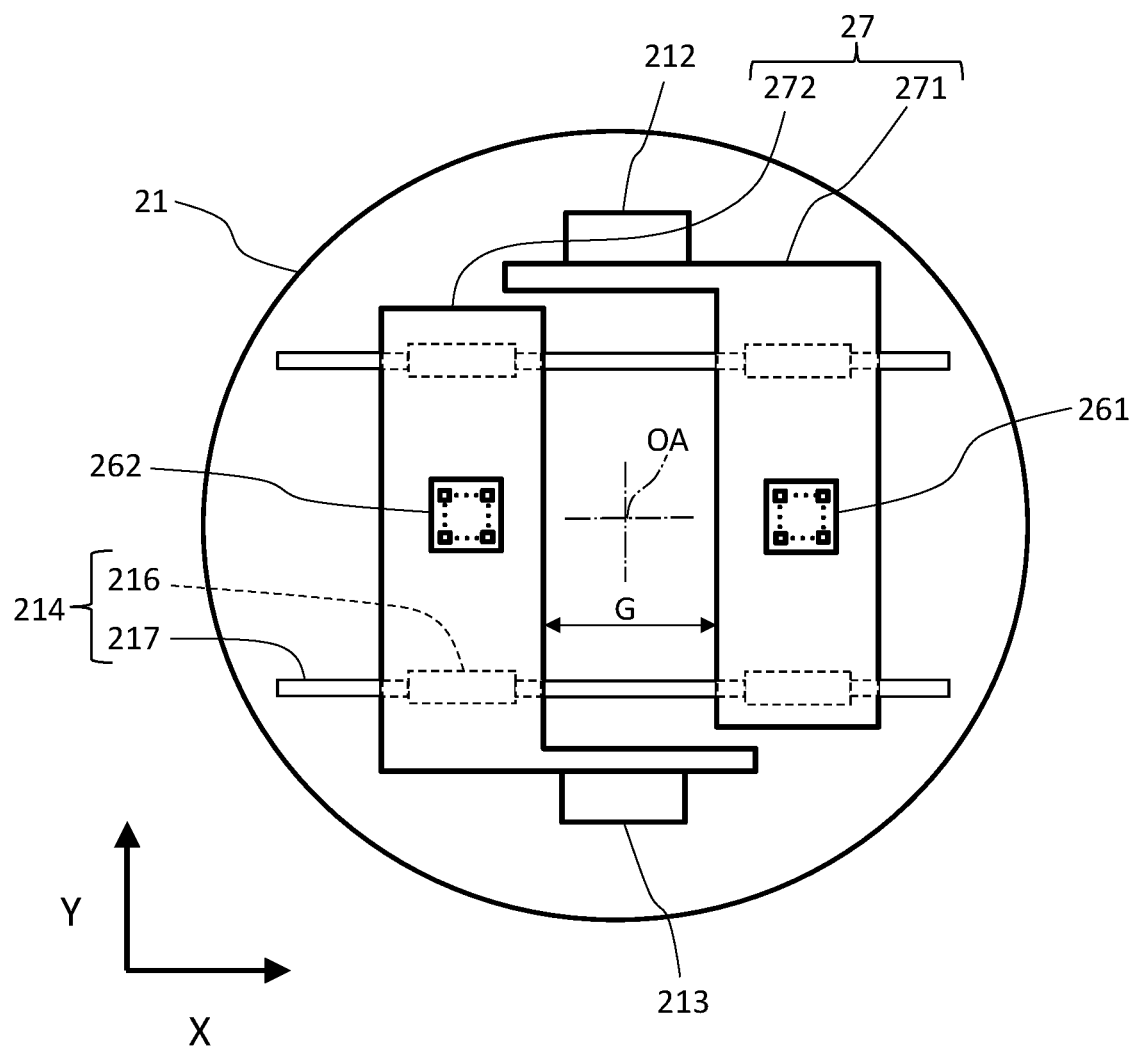
FIG. 6 is a plan view illustrating another operation example of the multiple-charged particle-beam irradiation apparatus according to the embodiment.

Accordingly, as illustrated in FIG. 6, a gap G through which all the beams can pass is formed between the first movable table 271 and the second movable table 272. After the gap G is formed, a process of adjusting an imaging distortion amount of an aperture image using the distortion adjusting lens 28, and a process of controlling a location where the multi-beams MB form a crossover using the illuminating lens 24 to adjust the imaging distortion amount of the aperture image are alternately performed until the imaging distortion amount has a value equal to or lower than a predetermined value, with control of the illuminating lens 24 and the distortion adjusting lens 28 by the lens control circuit 34. For example, a method described in Japanese Patent Application Laid-Open No. 2019-212680 disclosed by the present applicant can be used as a specific method of this beam adjustment based on the imaging distortion amount of an aperture image.

As described above, according to the multi-beam writing apparatus 1 according to the present embodiment, with movement of the movable table 27 on which the first blanking aperture array substrate 261 and the second blanking aperture array substrate 262 are mounted, one of the blanking aperture array substrates having been used until that time can be retracted from the optical axis OA and the other blanking aperture array substrate to be used next can be positioned on the optical axis OA. The blankers to be driven can be switched from those of the blanking aperture array substrate having been used until that time to those of the blanking aperture array substrate to be used next, and the alignment adjustment between the blanking aperture array substrate to be used next and the shaping aperture array substrate can be performed. Accordingly, the first blanking aperture array substrate 261 and the second blanking aperture array substrate 262 can be appropriately replaced while the vacuum state is maintained in the apparatus 1. Therefore, according to the present embodiment, the blanking aperture array substrates can be appropriately replaced while the reduction in the operation rate is prevented. With the same configuration of the first blanking aperture array substrate 261 and the second blanking aperture array substrate 262 as in the present embodiment, the apparatus life can be substantively extended while the reduction in the operation rate is prevented by switching between the first blanking aperture array substrate 261 and the second blanking aperture array substrate 262.

According to the multi-beam writing apparatus 1 of the present embodiment, the imaging distortion caused by the blanking aperture array substrates 261 and 262 can be adjusted after the beam adjustment in a state where there is no imaging distortion in the aperture image caused by the blanking aperture array substrates 261 and 262 is previously completed by performing the beam adjustment in the state where neither of the blanking aperture array substrates 261 and 262 is positioned on the optical axis OA. Furthermore, a situation in which beams that will not pass through the apertures A2 of the blanking aperture array substrates 261 and 262 are irradiated to the blanking aperture array substrates 261 and 262 due to an incomplete beam adjustment of an optical system other than the blanking aperture array substrates 261 and 262 and the blanking aperture array substrates 261 and 262 being accordingly damaged can be prevented.

According to the multi-beam writing apparatus 1 of the present embodiment, the first motor 212 and the second motor 213 can be arranged at the center location of thermal expansion of the movable table 27 by arranging the first motor 212 and the second motor 213 at locations overlapping with the optical axis OA in the Y direction. Therefore, the location misalignment between the motors 212 and 213 and the movable table 27 caused by thermal expansion of the movable table 27 can be minimized and the reliability of driving of the movable table 27 by the motors 212 and 213 can be improved.

The embodiment described above illustrates a preferred example of the multi-beam writing apparatus 1. However, the multi-beam writing apparatus 1 is not limited to the embodiment described above and various modifications described below may be applied thereto.

(First Modification)

Figure 7:
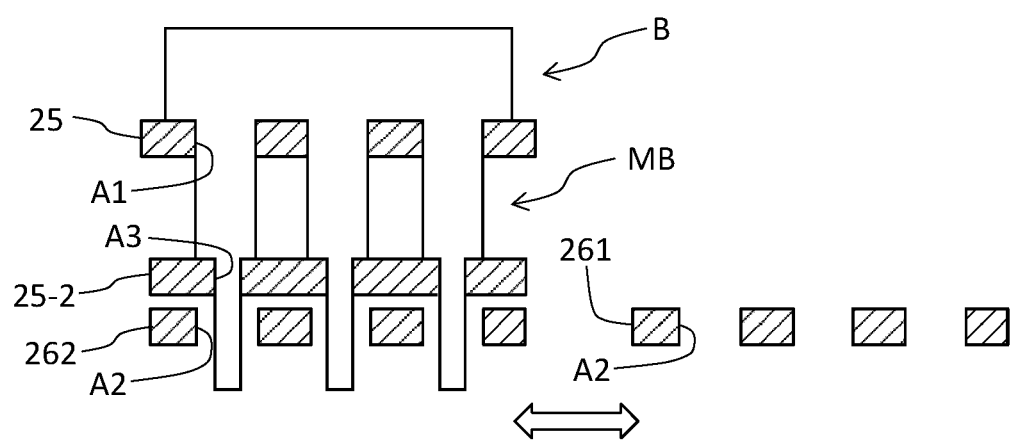
FIG. 7 is a cross-sectional view illustrating relevant parts of a multiple-charged particle-beam irradiation apparatus according to a first modification.

An example in which the first blanking aperture array substrate 261 and the second blanking aperture array substrate 262 have the same configuration has been explained above. In contrast thereto, as illustrated in FIG. 7, a second shaping aperture array substrate 25-2 on which apertures A3 (third apertures) smaller than the apertures A1 on the shaping aperture array substrate 25 are provided may be arranged on one blanking aperture array substrate 262 out of the blanking aperture array substrates 261 and 262 on the incident side of the multi-beams MB.

The apertures A3 of the second shaping aperture array substrate 25-2 are smaller than the apertures A2 of the blanking aperture array substrate 262. The second shaping aperture array substrate 25-2 is, for example, bonded to the blanking aperture array substrate 262 with a joining material such as an adhesive. The second shaping aperture array substrate 25-2 may be configured to be movable by an actuator in the horizontal direction with respect to the blanking aperture array substrate 262.

With the configuration described above, the blanking aperture array substrate 262 on which the second shaping aperture array substrate 25-2 is provided performs blanking deflection of the multi-beams MB where the size of each beam is reduced by the second shaping aperture array substrate 25-2. Therefore, an appropriate beam size according to required writing accuracy and writing speed can be selected by switching between the blanking aperture array substrates 261 and 262.

(Second Modification)

An example in which the movable table 27 is constituted of the first movable table 271 and the second movable table 272 has been explained above. In contrast thereto, the movable table 27 may have a single configuration as illustrated in FIG. 8.

Figure 8:
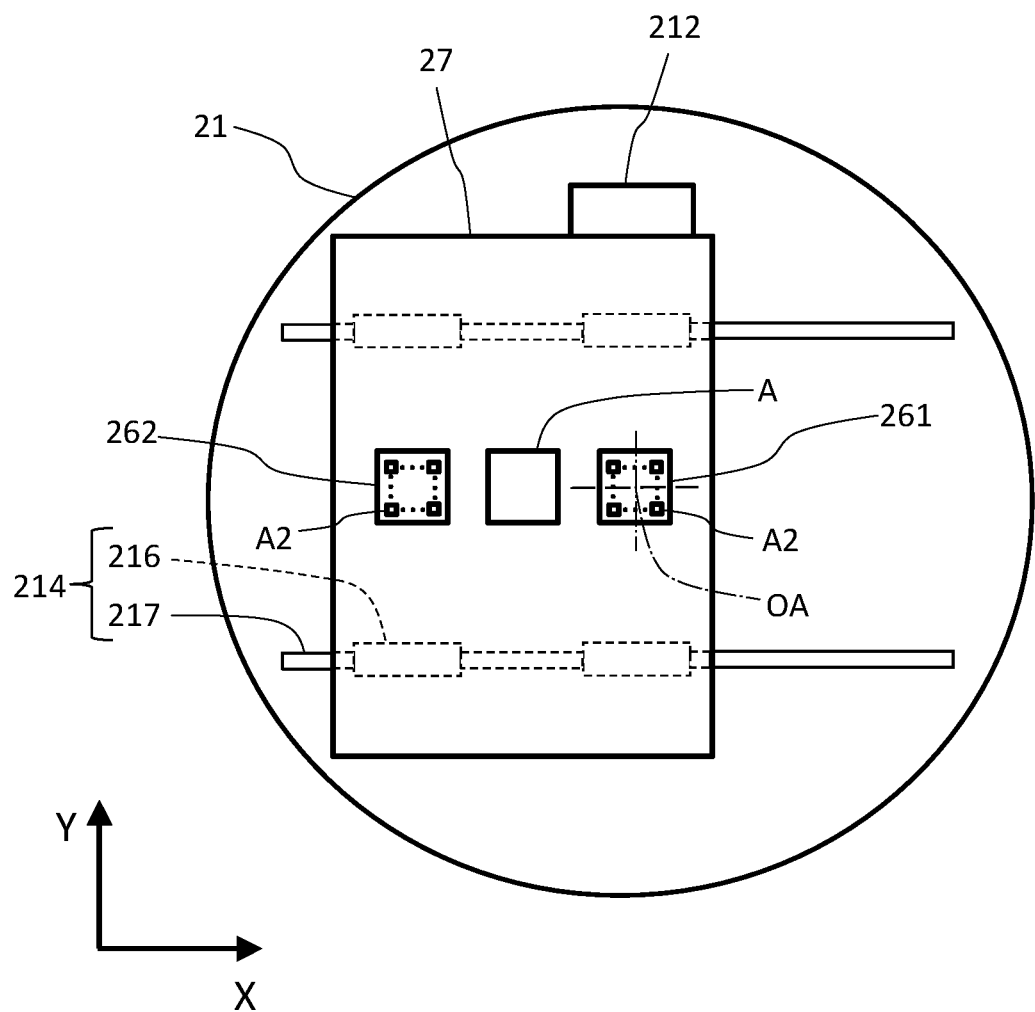
FIG. 8 is a cross-sectional view illustrating relevant parts of a multiple-charged particle-beam irradiation apparatus according to a second modification.

In an example illustrated in FIG. 8, the movable table 27 has both the first blanking aperture array substrate 261 and the second blanking aperture array substrate 262 mounted on a single configuration. An aperture A having such a size that causes all beams of the multi-beams MB to pass is provided on the movable table 27 between the first blanking aperture array substrate 261 and the second blanking aperture array substrate 262.

The movable table 27 can be moved to a location where all the beams can pass through the aperture A to allow the beam adjustment in a state where neither of the blanking aperture array substrates 261 and 262 is positioned on the optical axis OA. The movable table 27 is moved by the single motor 212.

Since the configuration described above can decrease the number of motors, the cost can be reduced.

(Third Modification)

Figure 9:
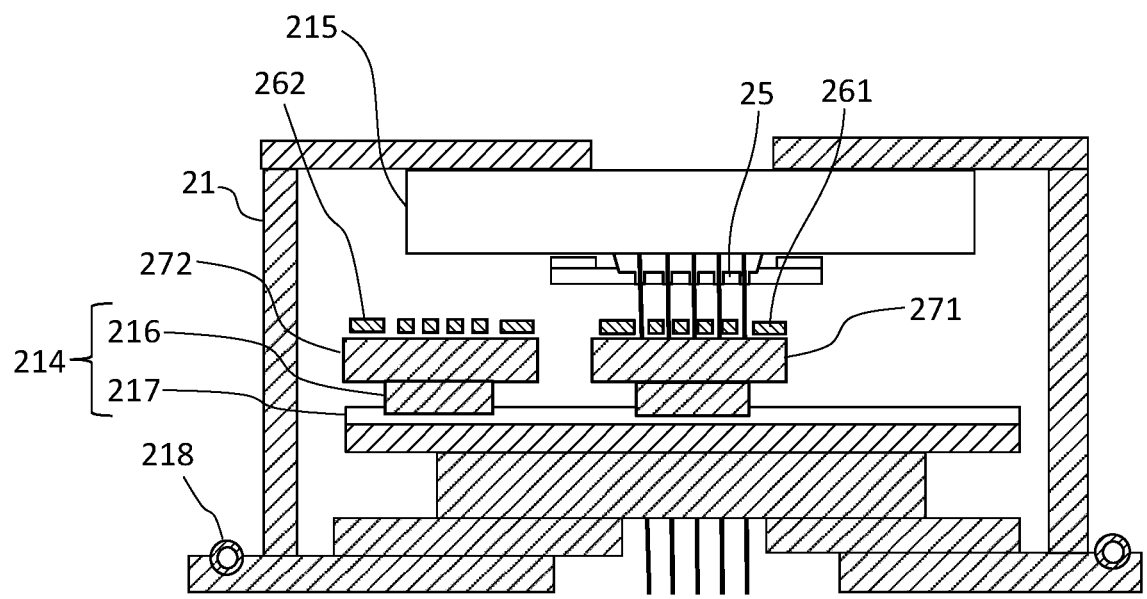
FIG. 9 is a cross-sectional view illustrating relevant parts of a multiple-charged particle-beam irradiation apparatus according to a third modification.

An example in which the XYZθ stage 215 that performs the alignment adjustment between the blanking aperture array substrate 261 or 262 on the optical axis OA and the shaping aperture array substrate 25 is arranged on the side of the blanking aperture array substrates 261 and 262 has been explained above. In contrast thereto, the XYZθ stage 215 may be arranged on the side of the shaping aperture array substrate 25 as illustrated in FIG. 9. That is, as illustrated in FIG. 2, the alignment mechanism (which may be a YZθ stage while being the XYZθ stage 215 in the examples illustrated in FIGS. 2 and 9) can be provided on the side of the blanking aperture array substrates 261 and 262 or may be provided on the side of the shaping aperture array substrate 25 as illustrated in FIG. 9. In this way, both the alignment mechanisms provided on the side of the blanking aperture array substrates 261 and 262 and on the side of the shaping aperture array substrate 25 correspond to an alignment mechanism defined in the claims of the present application.

According to the configuration described above, with movement of the XYZθ stage 215 and transmission of this movement to the shaping aperture array substrate 25 supported on the XYZθ stage 215, the shaping aperture array substrate 25 can be moved in the same direction as that of the XYZθ stage 215. This enables the alignment adjustment between the shaping aperture array substrate 25 and the blanking aperture array substrate 261 or 262 on the optical axis OA.

(Fourth Modification)

An example in which the first blanking aperture array substrate 261 and the second blanking aperture array substrate 262 are mounted as a plurality of blanking aperture array substrates on the movable table 27 has been explained above. However, the number of the blanking aperture array substrates is not limited to two. For example, as illustrated in FIG. 10, four blanking aperture array substrates 261 to 264, that is, the first blanking aperture array substrate 261, the second blanking aperture array substrate 262, a third blanking aperture array substrate 263, and a fourth blanking aperture array substrate 264 may be mounted on the movable table 27 of a single configuration on which the aperture A for the beam adjustment is provided.

Figure 10:
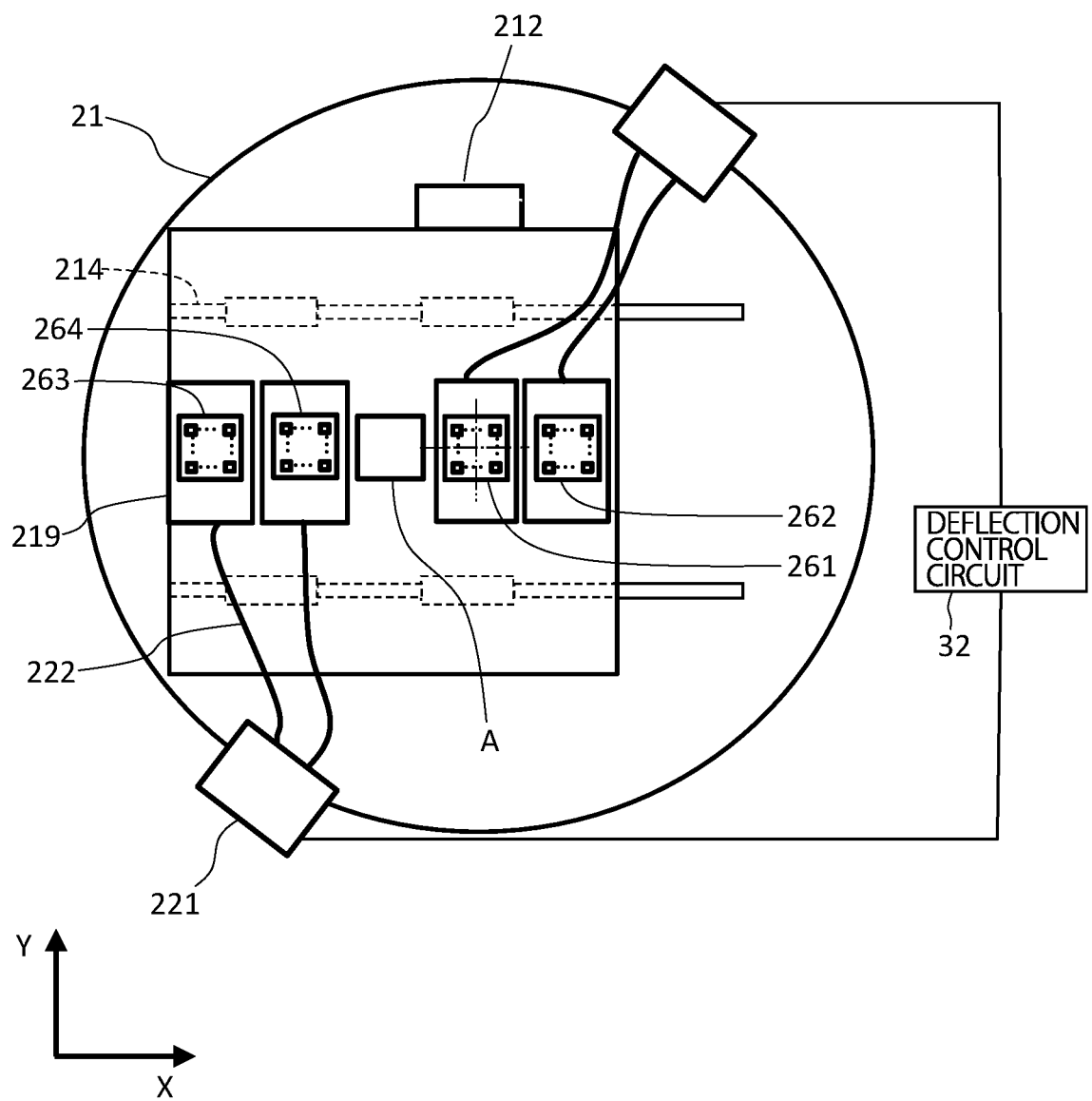
FIG. 10 is a cross-sectional view illustrating relevant parts of a multiple-charged particle-beam irradiation apparatus according to a fourth modification.

In the example illustrated in FIG. 10, the blanking aperture array substrates 261 to 264 are mounted on a mounting board 219. The blankers of each of the blanking aperture array substrates 261 to 264 are connected to the deflection control circuit 32 outside the electron beam lens barrel 21 via the mounting board 219, a line 222 having one end connected to the mounting board 219, and a feed-through terminal part 221 connected to the other end of the line 222. This configuration can be also applied to other embodiments.

Since this configuration can increase the number of the mounted blanking aperture array substrates 261 to 264, a substantive apparatus life can be further extended.

(Fifth Modification)

An example in which the four blanking aperture array substrates 261 to 264 are mounted on the movable table 27 of a single configuration has been explained in FIG. 10. In contrast thereto, as illustrated in FIG. 11, the four blanking aperture array substrates 261 to 264 may be dispersedly arranged on the movable table 27 constituted of the first movable table 271 and the second movable table 272.

Figure 11:
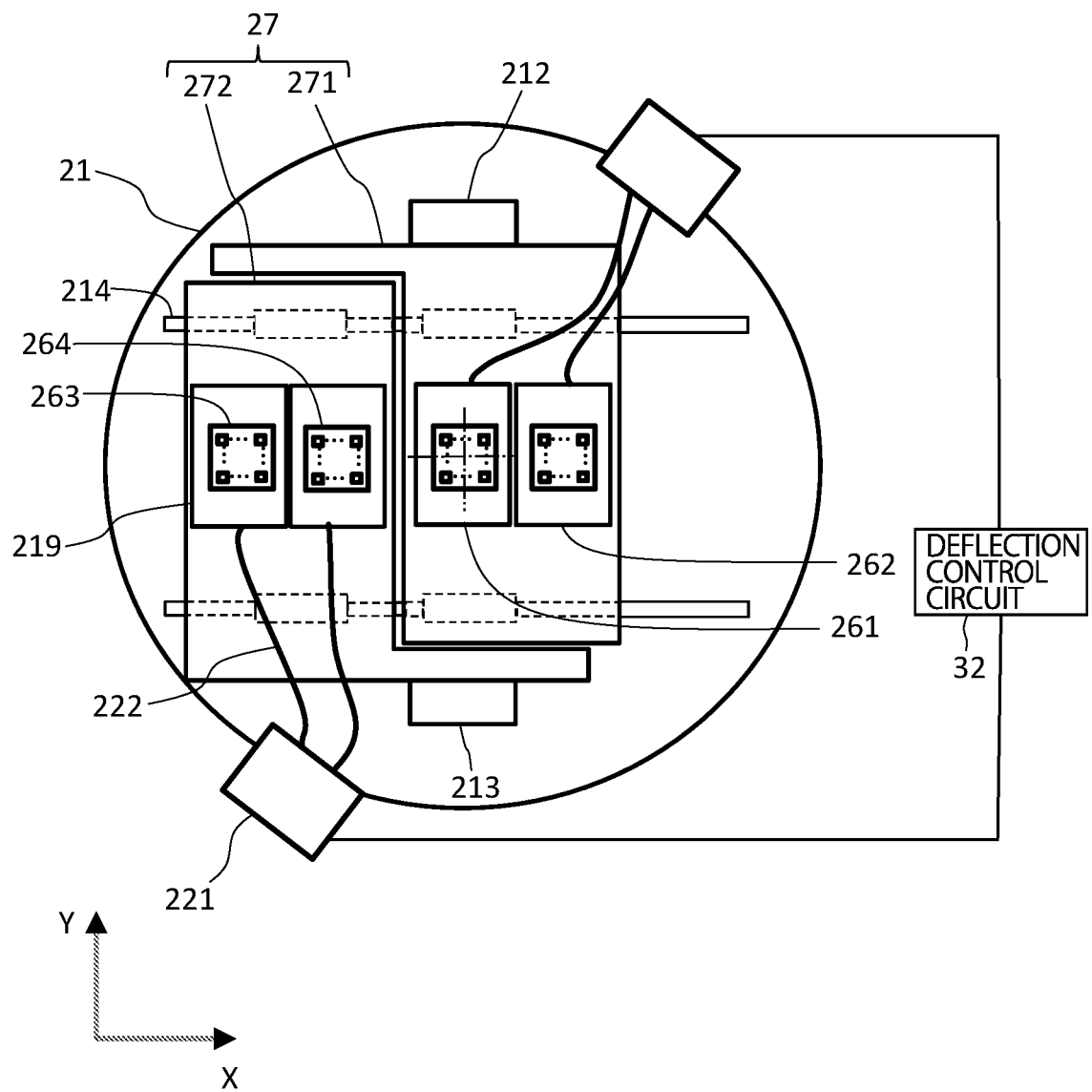
FIG. 11 is a cross-sectional view illustrating relevant parts of a multiple-charged particle-beam irradiation apparatus according to a fifth modification.

In the example illustrated in FIG. 11, the first blanking aperture array substrate 261 and the second blanking aperture array substrate 262 are mounted on the first movable table 271. The third blanking aperture array substrate 263 and the fourth blanking aperture array substrate 264 are mounted on the second movable table 272.

With this configuration, the number of the mounted blanking aperture array substrates 261 to 264 can be increased similarly in FIG. 10 and therefore the substantive apparatus life can be further extended.

(Sixth Modification)

Examples in which the blanking aperture array substrates are replaceable have been explained above. In contrast thereto, as illustrated in FIG. 12, the shaping aperture array substrate may also be configured to be replaceable as well as the blanking aperture array substrates.

Figure 12:
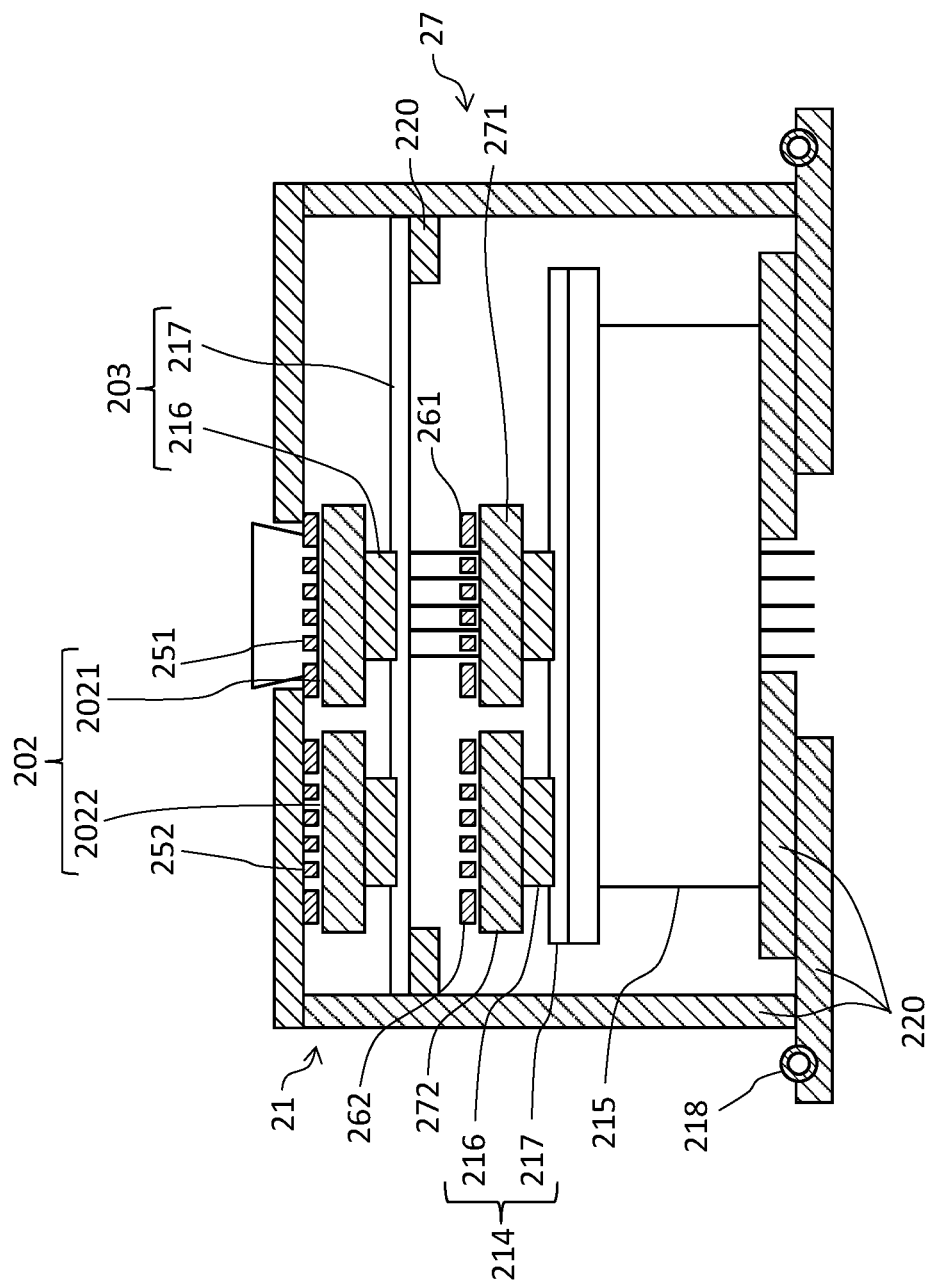
FIG. 12 is a cross-sectional view illustrating relevant parts of a multiple-charged particle-beam irradiation apparatus according to a sixth modification.

Specifically, the multi-beam writing apparatus 1 includes two shaping aperture array substrates 251 and 252, that is, the first shaping aperture array substrate 251 and a second shaping aperture array substrate 252 in an example illustrated in FIG. 12. The multi-beam writing apparatus 1 further includes a second movable table 202 and second movement guide members 203 in addition to the configuration illustrated in FIG. 2.

The second movable table 202 is a member on which the shaping aperture array substrates 251 and 252 are mounted in the X direction (the second direction) while being spaced apart from each other and that moves in the X direction to position one of the shaping aperture array substrates 251 and 252 on the optical axis OA. More specifically, the second movable table 202 includes a first movable table 2021 on which the first shaping aperture array substrate 251 is mounted, and a second movable table 2022 on which the second shaping aperture array substrate 252 is mounted. Specific configurations of the first movable table 2021 and the second movable table 2022 for the shaping aperture array substrates 251 and 252 are same as the configuration of the first movable table 271 and the second movable table 272 for the blanking aperture array substrates 261 and 262. Similarly to the first movable table 271 and the second movable table 272 for the blanking aperture array substrates 261 and 262, the first movable table 2021 and the second movable table 2022 for the shaping aperture array substrates 251 and 252 are respectively driven by different motors (not illustrated) to move in the X direction. The driving by the motors is controlled by the movement control circuit 33 illustrated in FIG. 1. The movements in the X direction of the first movable table 2021 and the second movable table 2022 are guided by two sets of the second movement guide members 203 common to the first movable table 2021 and the second movable table 2022. Each of the second movement guide members 203 includes the guide blocks 216 respectively fixed to bottom surfaces of the first movable table 2021 and the second movable table 2022, and the guide rail 217 extending in the X direction and slidably supporting the guide blocks 216, similarly to the movement guide members 214 for the blanking aperture array substrates 261 and 262. The various modifications of the movable table 27 for the blanking aperture array substrates 261 and 262 described above can be applied also to the second movable table 202 for the shaping aperture array substrates 251 and 252. A third shaping aperture array substrate on which apertures (third apertures) smaller than the apertures of the shaping aperture array substrates 251 and 252 are provided may be mounted on one of the shaping aperture array substrates 251 and 252. Accordingly, the beam size can be changed in the vacuum with the switching between the shaping aperture array substrates 251 and 252.

According to the configuration illustrated in FIG. 12, one of the shaping aperture array substrates having been used until that time can be retracted from the optical axis OA and the other shaping aperture array substrate to be used next can be positioned on the optical axis OA, with movement of the second movable table 202 on which the first shaping aperture array substrate 251 and the second shaping aperture array substrate 252 are mounted. Accordingly, switching between the first shaping aperture array substrate 251 and the second shaping aperture array substrate 252 as well as the switching between the first blanking aperture array substrate 261 and the second blanking aperture array substrate 262 can be performed while the vacuum state is maintained in the apparatus 1. Therefore, the substantive apparatus life can be further extended while deterioration of the operation rate is prevented.

At least a part of the multi-beam writing apparatus 1 can be constituted by hardware or by software. When it is constituted by software, the multi-beam writing apparatus 1 can be configured such that a program for realizing at least a part of the functions of the multi-beam writing apparatus 1 is stored in a recording medium such as a flexible disk or a CD-ROM, and the program is read and executed by a computer. The recording medium is not limited to a detachable device such as a magnetic disk or an optical disk, and may be a fixed recording medium such as a hard disk device or a memory.

The embodiments described above have been presented by way of example only and are not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

The invention claimed is:

1. A multiple-charged particle-beam irradiation apparatus comprising:
   an emitter configured to emit a charged particle beam;
   a shaping aperture array substrate on which a plurality of first apertures are provided and configured to partially enable the charged particle beam to pass through the first apertures to form multi-beams;
   a plurality of blanking aperture array substrates each provided with a plurality of second apertures, which enable corresponding beams of the multi-beams to pass, and comprising blankers respectively disposed in the second apertures to perform blanking deflection of the beams;
   a movable table on which the blanking aperture array substrates are mounted so as to be spaced apart from each other in a second direction, which is orthogonal to a first direction along an optical axis, and configured to move in the second direction to position one of the blanking aperture array substrates on the optical axis; and
   an alignment mechanism configured to perform an alignment adjustment between one of the blanking aperture array substrates positioned on the optical axis and the shaping aperture array substrate.

2. The apparatus of claim 1, further comprising a control circuit configured to switch among the blankers of the blanking aperture array substrates to be driven to drive blankers of one blanking aperture array substrate located on the optical axis.

3. The apparatus of claim 1, wherein the alignment mechanism is common to the blanking aperture array substrates.

4. The apparatus of claim 1, wherein the movable table has an aperture of a size enabling all beams of the multi-beams to pass between the blanking aperture array substrates, and is capable of moving to a location where the aperture enables all the beams to pass in order to allow a beam adjustment in a state where none of the blanking aperture array substrates is positioned on the optical axis.

5. The apparatus of claim 1, wherein
   the movable table comprises
   a first movable table on which some blanking aperture array substrates among the blanking aperture array substrates are mounted, and
   a second movable table on which other blanking aperture array substrates among the blanking aperture array substrates are mounted, and
   the first movable table and the second movable table are respectively capable of moving to a location where a gap of a size enabling all beams of the multi-beams to pass is formed between the first movable table and the second movable table in order to allow a beam adjustment in a state where none of the blanking aperture array substrates is positioned on the optical axis.

6. The apparatus of claim 1, further comprising an actuator configured to drive the movable table, wherein the actuator is arranged at a location overlapping with the optical axis in a third direction orthogonal to both the first direction and the second direction.

7. The apparatus of claim 1, further comprising a second shaping aperture array substrate which is disposed on at least one of the blanking aperture array substrates and is provided with third apertures smaller than the first apertures of the shaping aperture array substrate.

8. The apparatus of claim 1, wherein
a plurality of the shaping aperture array substrates are provided, and
the apparatus further comprises
a second movable table on which the shaping aperture array substrates are mounted so as to be spaced apart from each other in the second direction and being configured to move in the second direction to position one of the shaping aperture array substrates on the optical axis.

9. A multiple-charged particle-beam irradiation method comprising:
moving a movable table in a second direction orthogonal to a first direction along an optical axis to position one of a plurality of blanking aperture array substrates on the optical axis, the movable table mounting the blanking aperture array substrates so as to be spaced apart from each other in the second direction, each of the blanking aperture array substrates being provided with a plurality of second apertures and a blanker for each of the second apertures;
performing an alignment adjustment between one of the blanking aperture array substrates positioned on the optical axis and a shaping aperture array substrate which is provide with a plurality of first apertures;
emitting a charged particle beam;
partially causing the charged particle beam to pass through the first apertures using the shaping aperture array substrate to form multi-beams; and
performing blanking deflection of corresponding beams of the multi-beams using blankers of one of the blanking aperture array substrates positioned on the optical axis.

* * * * *